United States Patent [19]

Sakurai et al.

[11] Patent Number: 5,506,540

[45] Date of Patent: Apr. 9, 1996

[54] BIAS VOLTAGE GENERATION CIRCUIT

[75] Inventors: Kiyofumi Sakurai, Yokohama; Tohru Furuyama, Tokyo, both of Japan

[73] Assignee: Kabushiki Kaisha Toshiba, Kawasaki, Japan

[21] Appl. No.: 202,082

[22] Filed: Feb. 25, 1994

[30] Foreign Application Priority Data

Feb. 26, 1993 [JP] Japan ..................... 5-038187

[51] Int. Cl.$^6$ ............................ G05F 1/10; G05F 3/02
[52] U.S. Cl. ..................... 327/535; 327/534; 327/540
[58] Field of Search ........................ 327/537, 536, 327/535, 534, 540, 541, 546, 534, 535

[56] References Cited

U.S. PATENT DOCUMENTS

| | | | |
|---|---|---|---|
| 4,223,238 | 9/1980 | Parkinson et al. | 327/536 |
| 4,631,421 | 12/1986 | Inoue et al. | 327/536 |
| 4,794,278 | 12/1988 | Vajdic | 327/536 |
| 4,961,007 | 10/1990 | Kumanoya et al. | 307/296.2 |
| 5,034,625 | 7/1991 | Min et al. | 327/536 |
| 5,243,228 | 9/1993 | Maruyama et al. | 327/578 |
| 5,264,808 | 11/1993 | Tanaka | 327/534 |
| 5,315,166 | 5/1994 | Arimoto | 327/537 |
| 5,341,035 | 8/1994 | Shibayama et al. | 327/537 |

*Primary Examiner*—Timothy P. Callahan
*Assistant Examiner*—Terry L. Englund
*Attorney, Agent, or Firm*—Banner & Allegretti, Ltd.

[57] ABSTRACT

A bias voltage generation circuit has a bias voltage generation means and a VBB detector. The bias voltage generation means is made up of a charge pump circuit, and a ring oscillator for biasing a P-type region to have a predetermined potential level. The VBB detector detects the bias level of the P-type region and controls the bias generation means. The VBB detector incorporates a bias level detection circuit, and two delay circuits which are controlled on the basis of a signal appearing at an output node N2 of the bias level detection circuit. The ring oscillator is controlled on the basis of outputs of the two delay circuits. One of the two delay circuits has a higher detection level and is therefore less responsive to the signal at the output node N2 than the other delay circuit, but provides a shorter delay time than that provided by the other delay circuit.

9 Claims, 6 Drawing Sheets

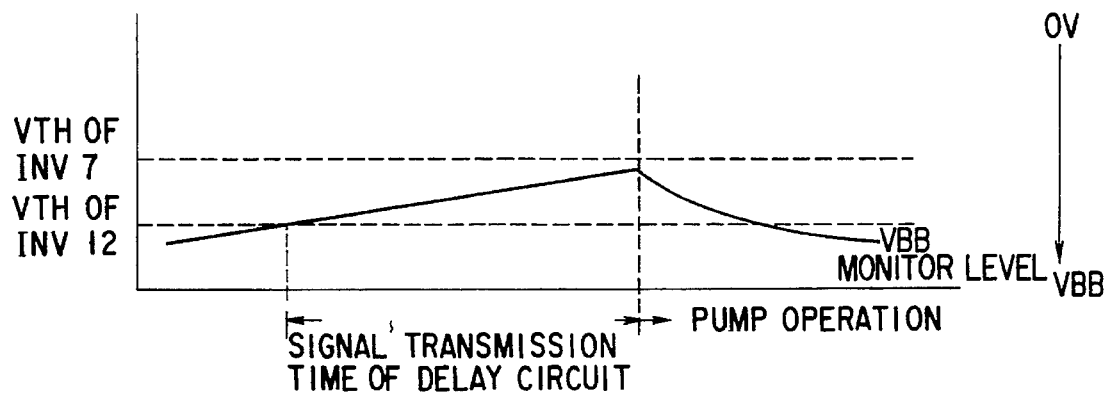
F I G. 5
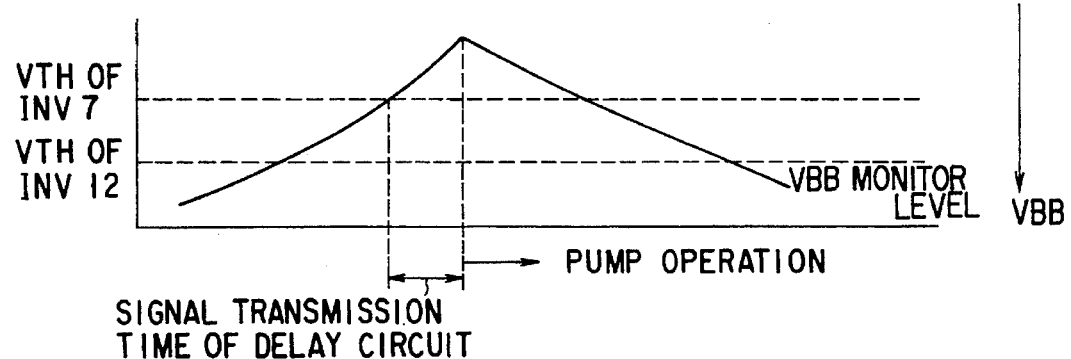
F I G. 6
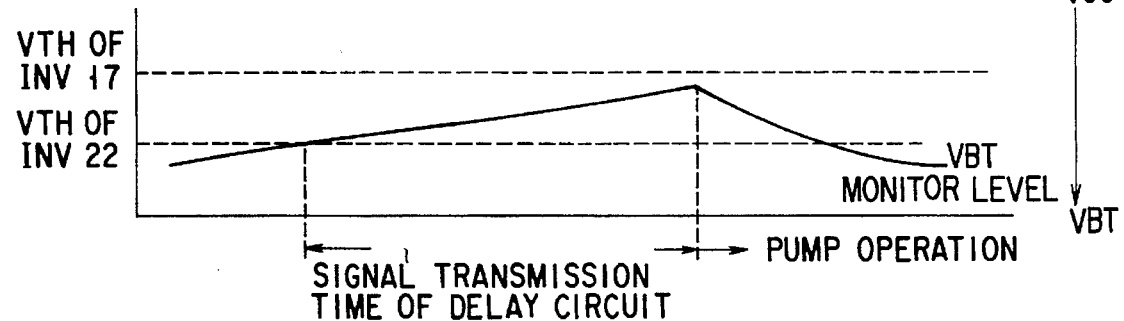
F I G. 8
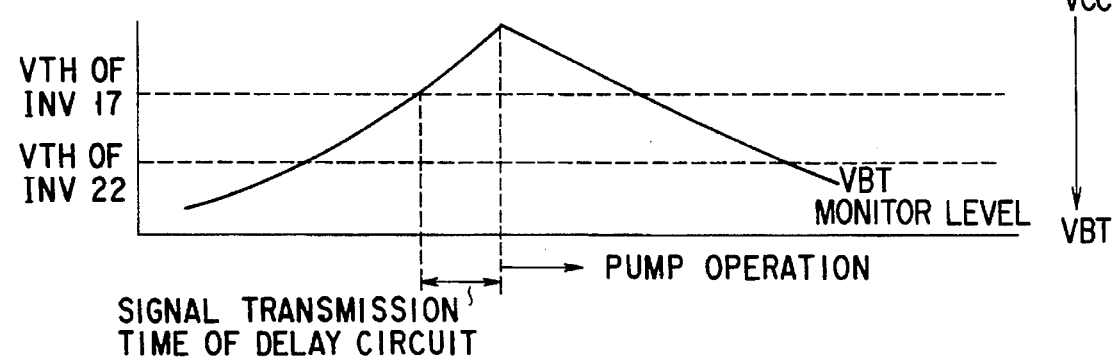
F I G. 9

BIAS VOLTAGE GENERATION CIRCUIT

BACKGROUND OF THE INVENTION

1. Field of the Invention

The present invention relates to a bias voltage generation circuit for use in a semiconductor memory device wherein a stable bias must be applied to the substrate (including well regions therein).

2. Description of the Related Art

In a DRAM, a negative potential is applied to the substrate's internal regions corresponding to the back gate of an N-type transistor (namely, the substrate itself and the well regions formed therein), so as to control the threshold of the N-type transistor. The bias level VBB is applied not by an external power supply but by a bias voltage generation circuit located inside the chip. In some cases, the bias level VBB may become close to 0V, due to the operation of the circuits formed on the substrate. If the bias level VBB is high, the threshold of the N-type transistor will vary, resulting in an increase in the amount of leak current. If the bias level VBB is as high as 0V, it is likely that a latch-up phenomenon will occur. The time when a maximum amount of current is generated in the substrate is the time where the data in memory cells are accessed. Since a large number of transistors simultaneously operate at the time, the bias level VBB rises and becomes close to 0V.

FIG. 1 is a circuit diagram showing a conventional substrate bias generation circuit. The substrate bias generation circuit comprises a VBB detector 11, a ring oscillator 12, and a charge pump circuit 13 for generating a negative voltage, and biasing a P-type region 14 in the substrate to be a predetermined negative potential.

The charge pump circuit 13 is driven by the oscillation frequency of the ring oscillator 12 and generates a bias level VBB. In the bias voltage generation circuit, the VBB detector 11 is connected to the input terminal of the ring oscillator 12 and stops the oscillation of the ring oscillator 12 when the bias level VBB reaches a predetermined potential level.

As is shown in FIG. 1, the VBB detector 11 includes a detection circuit 15 for determining whether the bias level VBB is a normal value or not, and a delay circuit 16. The detection circuit 15 is made up of P-channel MOS transistor TR1, N-channel MOS transistors TR2–TR7, and P-channel MOS transistor TR8. The current paths of these MOS transistors TR1–TR8 are connected in series. The N-channel transistors TR2–TR7 are applied with gate voltages for maintaining them to be in a conductive state. At the connection node N1 located between the current paths of transistors TR1 and TR2, a VBB monitor level appears, which corresponds to the potential difference between a power supply voltage VCC and the bias level VBB. The delay circuit 16 is made up of inverters INV1–INV5.

When the power supply is switched on, the power supply voltage VCC is applied to the VBB detector 11, and transistor TR1 is turned on. Since, at the time, the bias level VBB is in the floating state, transistors TR2–TR8 remain in the OFF state. Therefore, the VBB monitor level at the connection node N1 is "H". A signal due to this VBB monitor level passes through the delay circuit 16 and causes the output of the delay circuit 16 to become "L" in level. Then, this output of the delay circuit 16 causes the output of inverter INV6 to become "H" in level, thereby starting the oscillation of the ring oscillator 12. After the bias level VBB reaches the predetermined potential level, the VBB monitor level at the connection node N1 is "L". In this case, the output of the VBB detector 11 is set to be "L" in level by both the delay circuit 16 and inverter INV6, thereby stopping the oscillation of the ring oscillator 12.

In the circuit configuration mentioned above, the amount of current consumed is large when the ring oscillator 12 is frequently switched between ON and OFF. Therefore, the VBB detector 11 is made to comprise the delay circuit 16 so as not to be too sensitive after the bias level VBB reaches the predetermined potential level. In addition, the delay circuit 16 is designed to suppress a rush current since it is supplied with a signal having a very obtuse waveform. To be more specific, transistors TR19 and TR20 located on the side of the P-channel MOS transistors are connected in series with each other, so as to cause transistor TR20 to serve as a resistor, as is shown in FIG. 1. This circuit configuration operates in a satisfactory manner when the bias level VBB rises gradually, but does not when the bias level VBB rises momentarily.

In the case of a DRAM, the amount of current flowing in the substrate becomes largest when a memory cell is activated in response to the determination of a row address. In particular, in the case where the DRAM is of a multi-bit structure, the number of memory cell arrays is large. Therefore, the bias level VBB rises momentarily, and the restart time of the charge pump circuit 13 is inevitably delayed.

SUMMARY OF THE INVENTION

As described above, the conventional bias voltage generation circuit is not appropriate for use when the bias level VBB rises momentarily.

Accordingly, an object of the present invention is to provide a bias voltage generation circuit for use in a semiconductor memory device, which can maintain the back gate bias at a stable level in a memory region.

This object is achieved by a bias voltage generation circuit for use in a semiconductor memory device, which comprises:

bias voltage generation means for permitting an internal region of a semiconductor substrate to have a predetermined bias potential;

detection means for detecting the bias potential so as to control the bias voltage generation means; and signal control means, incorporated in the detection means and including at least two delay circuits of different detection levels, for controlling the bias voltage generation means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a first waveform chart showing how the monitor level of the VBB detector in FIG. 3 changes;

FIG. 6 is a second waveform chart also showing how the monitor level of the VBB detector in FIG. 3 changes;

FIG. 8 is a first waveform chart showing how the monitor level of the VBT detector in FIG. 7 changes; and FIG. 9 is a second waveform chart also showing how the monitor level of the VBT detector in FIG. 7 changes.

DETAILED DESCRIPTION OF THE PREFERRED EMBODIMENTS

Figure 2:
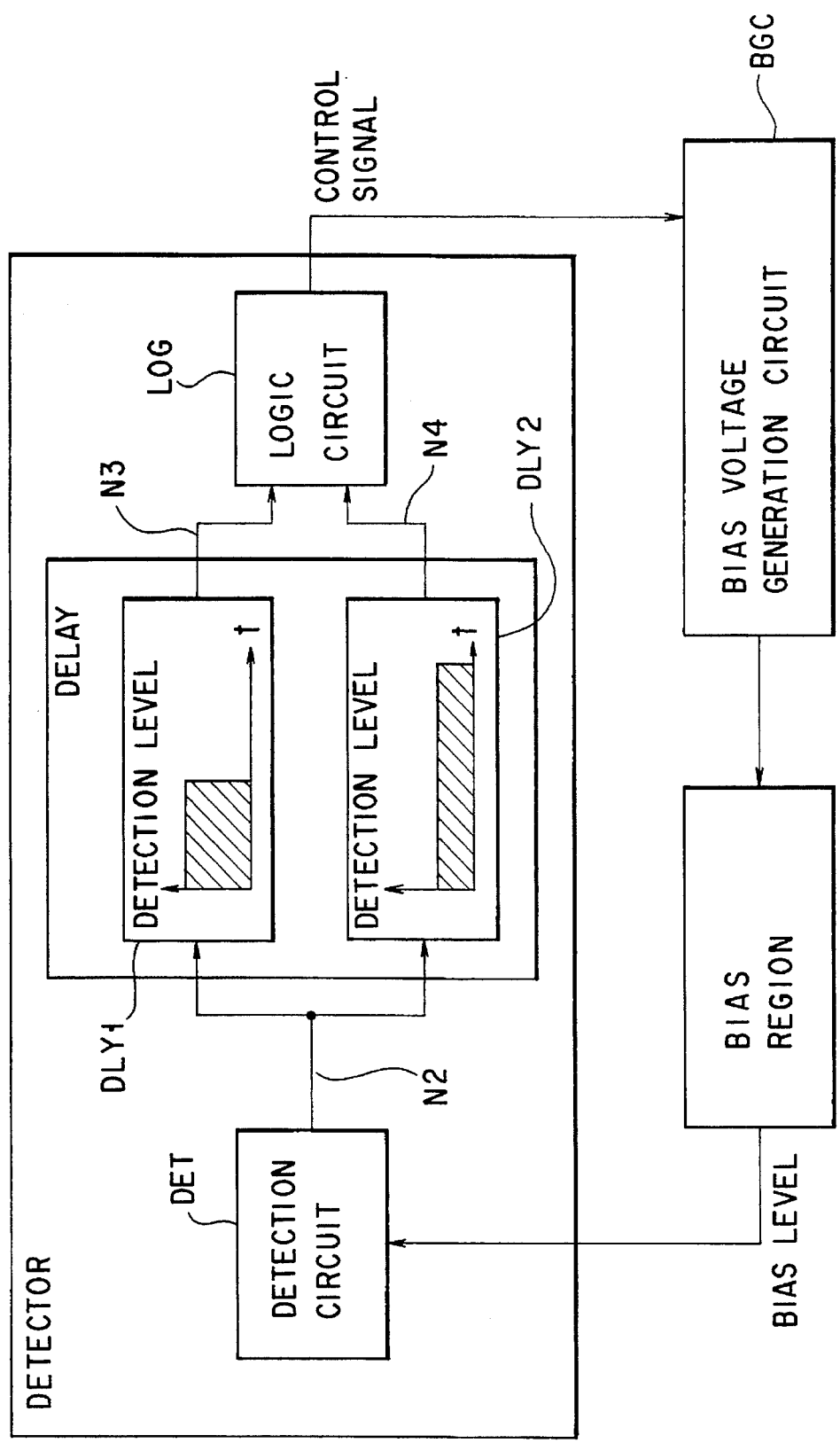
FIG. 2 is a block circuit diagram showing a conceptual system according to the present invention.

FIG. 2 is a block circuit diagram showing a conceptual system according to the present invention. A bias voltage generation circuit BGC generates a predetermined bias voltage, and applies this bias voltage to a predetermined region. A detection circuit DET detects whether or not the bias level of the predetermined region reaches a reference level, and supplies a detection level signal from the detection circuit DET to two delay circuits DLY1 and DLY2. Of the two delay circuits DLY1 and DLY2, delay circuit DLY1 has a higher detection level and can transmit a signal to a logic circuit faster than delay circuit DLY2. A control signal obtained by the logic circuit LOG is used for controlling the bias voltage generation circuit BGC.

Figure 1:
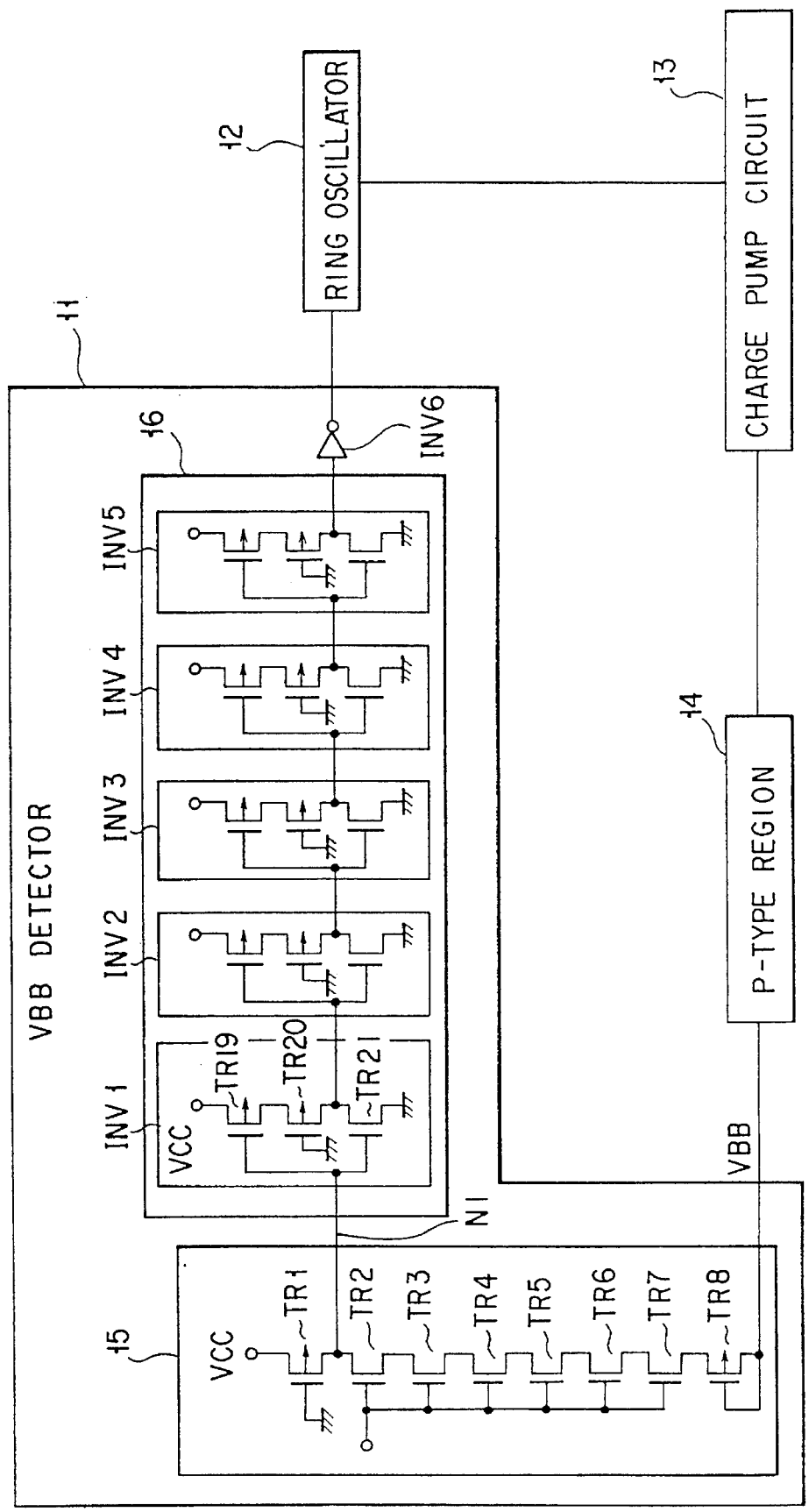
FIG. 1 is a circuit diagram showing a conventional bias voltage generation circuit.
Figure 3:
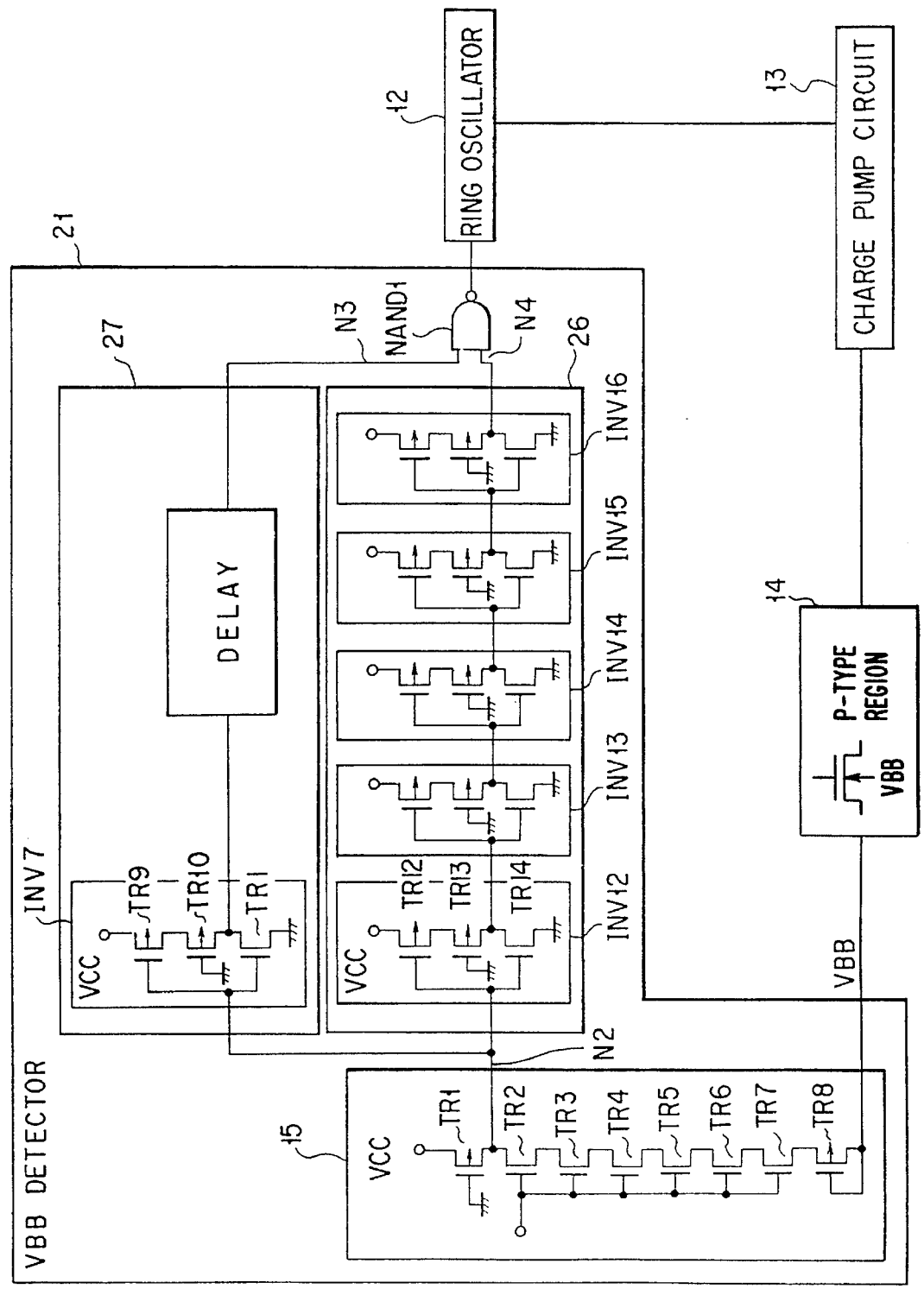
FIG. 3 is a circuit diagram showing the circuit configuration according to the first embodiment of the present invention.

FIG. 3 is a circuit diagram showing the circuit configuration according to the first embodiment of the present invention. The circuit depicted in FIG. 3 differs from that depicted in FIG. 1 only in the configuration of the VBB detector 21. The VBB detector 21 incorporates a detection circuit 15 similar to that depicted in FIG. 1 so as to determine whether the bias level VBB is a normal value or not, but the VBB detector 21 incorporates two delay circuits 26 and 27.

The two delay circuits 26 and 27 detect the monitor level of the detection circuit 15 (i.e., the level at node N2) and turn the ring oscillator 12 on or off. One (26) of the two delay circuits has a similar configuration to that of the delay circuit shown in FIG. 1, but the other delay circuit (27) has a higher detection level than that of the delay circuit shown in FIG. 1 and further has a higher signal transmission speed than that of delay circuit 26. If it is assumed that VTH(INV12) denotes the threshold of the inverter INV12 connected directly to the input terminal of delay circuit 26 and that VTH(INV7) denotes the threshold of the inverter INV7 connected directly to the input terminal of delay circuit 27, then the following relationship is satisfied: VTH(INV12)< VTH(INV7). That is, delay circuit 27 cannot be driven as easily as delay circuit 26. It should be noted that delay circuit 27 is designed such that the time required for a signal to reach the output terminal (i.e., node N3) is shorter than the delay time determined by the inverters INV12–INV16 of delay circuit 26. Incidentally, the logical output of delay circuit 27 complies with the logic of delay circuit 26.

Figure 4:
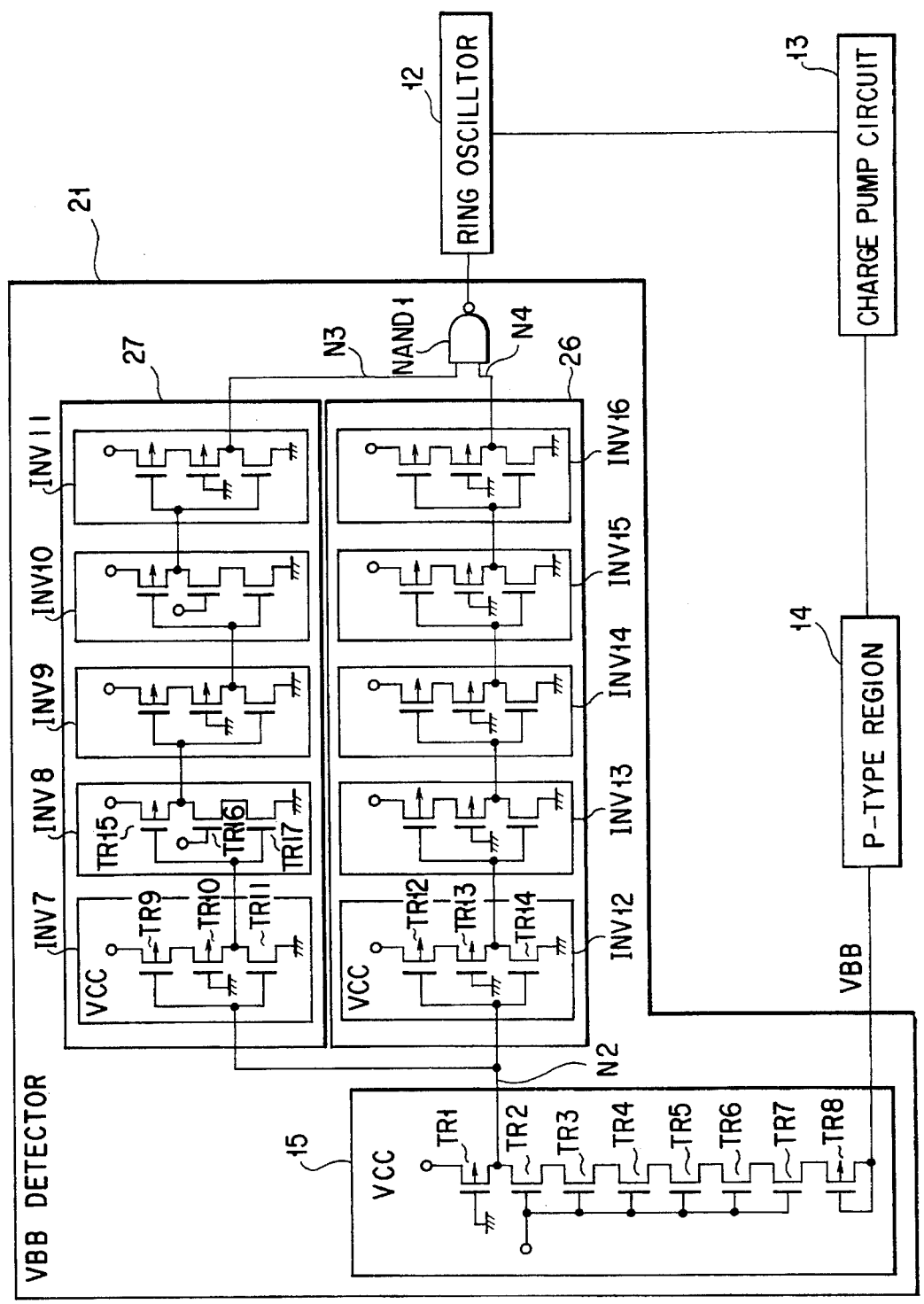
FIG. 4 is a circuit diagram specifically showing the circuit configuration depicted in FIG. 3.

FIG. 4 is a circuit diagram specifically showing the circuit configuration depicted in FIG. 3. Each of inverters INV7, INV9 and INV11 of delay circuit 27 is made up of P-channel MOS transistors TR9 and TR10 and N-channel MOS transistor TR11. Transistor TR10 serves to suppress a rush current since the signal supplied thereto from node N2 has an obtuse-angle waveform. The threshold VTH of each of inverters INV7, INV9 and INV11 is determined by the ratio of the current-driving capacity of transistors TR9 and TR10 to that of transistor TR11. Each of inverters INV8 and INV10 of delay circuit 27 is made up of P-channel MOS transistor TR15 and N-channel MOS transistors TR16 and TR17. Transistor TR16 serves to suppress a rush current since the signal supplied thereto has an obtuse-angle waveform. The threshold VTH of each of inverters INV8 and INV10 is determined by the ratio of the current-driving capacity of transistor TR15 to that of transistors TR16 and TR17. The delay speed provided by the inverters INV7–INV11 is greatly dependent on both the sizes and the number of transistors employed.

Transistors TR10 of inverters INV7, INV9 and INV11 have a function of causing a signal to have an obtuse-angle waveform when the level of the signal at the input terminal changes from "H" to "L". Likewise, transistors TR16 of inverters INV8 and INV10 have a function of causing a signal to have an obtuse-angle waveform when the level of the signal at the input terminal changes from "L" to "H". In other words, the signal transmission speed of inverters INV7, INV9 and INV11 is high when the level of the signal at the input terminal changes from "L" to "H", and the signal transmission speed of inverters INV8 and INV10 is high when the level of the signal at the input terminal changes from "H" to "L".

In inverter INV12 of delay circuit 26, the ratio of the current driving capacity of transistors TR12 and TR13 to the ratio of that of transistor TR14 is determined such that the current driving capacity of the transistors located on the side of the P-channel MOS transistors is higher than the corresponding current driving capacity of inverter INV7 mentioned above. Therefore, the threshold of inverter INV7 is higher than that of inverter INV12.

The signals output from the delay circuits 26 and 27, i.e., the signals at nodes N3 and N4, are supplied to a NAND gate NAND1, and an output of this NAND gate controls both the ring oscillator 12 and the charge pump circuit 13 to bias the P-type region 14 to be in a negative potential state.

The VBB detector 21 operates as follows when the power supply is turned on, the signal at node N2 is "H" in level. This "H"-level signal is supplied to each of delay circuits 26 and 27, and "L"-level signals appear at nodes N3 and N4. Since, therefore, the output of NAND gate NAND1 is "H" in level, the ring oscillator 12 is actuated, and the charge pump circuit 13 lowers the level of the P-type region 14 to a predetermined negative potential level. When the level of the P-type region 14 has been lowered to the predetermined level, the monitor level (i.e., the level of the signal at node N2) is low. Since, therefore, "H"-level signals appear at nodes N3 and N4, the output of NAND gate NAND1 becomes "L" in level, thus stopping the ring oscillator 12.

The case where the bias level VBB gradually rises due to a substrate current or the like will be explained with reference to FIG. 5. When the bias level VBB gradually rises, inverter INV12 of delay circuit 26 detects the signal level at monitor node N2 as "H" before inverter INV7 of delay circuit 27 detects so, since the threshold VTH of inverter INV12 is lower than that of inverter INV7. As a result, an "L"-level signal appears at node N4. Since, therefore, the output of NAND gate NAND1 becomes "H" in level, the ring oscillator 12 is restarted. During the time, delay circuit 27 detects the monitor level as "L" because the threshold VTH of inverter INV7 of delay circuit 27 is high. Therefore, the signal at node N3 remains in the "H" level.

The case where the bias level VBB rapidly rises will be explained with reference to FIG. 6. When the bias level VBB rapidly rises, the signal level at node N2 also rises rapidly. Therefore, inverter INV12 is first turned on, and immediately thereafter inverter INV7 is turned on. Since, in this case, the signal level at node N2 changes from "L" to "H", the signal transmission speed of delay circuit 27 is higher than that of delay circuit 26.

Therefore, the level of the signal at node N3 becomes "H" before the level of the signal at node N4, and the ring oscillator 12 is actuated. The time at which the ring oscillator 12 is stopped is determined by the delay circuit having a lower signal transmission speed. In other words, the ring oscillator 12 is stopped at the time determined by the delay circuit of the conventional circuit configuration.

In the embodiment described above, the P-type region to which the bias level VBB is applied is a semiconductor region serving as the back gate of an N-channel MOS transistor. The P-type region is, for example, either a P-type substrate or a P-well region formed in the surface of an N-type substrate.

Figure 7:
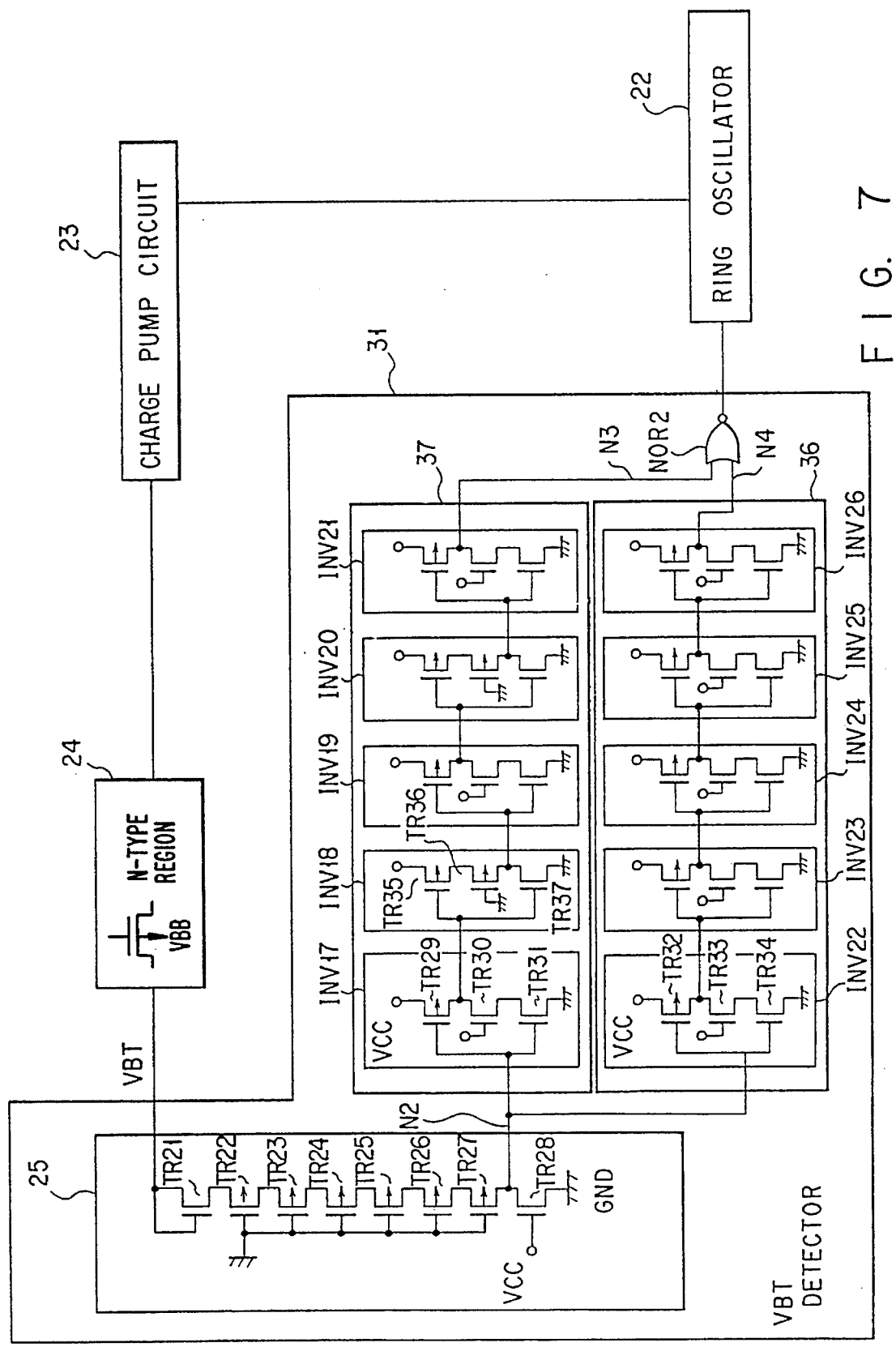
FIG. 7 is a circuit diagram showing the circuit configuration according to the second embodiment of the present invention.

FIG. 7 is a circuit diagram showing the circuit configuration according to the second embodiment of the present invention. The circuit configuration of the second embodiment is that for a bias voltage generation circuit, and the substrate's internal regions to be biased by the circuit are N-type regions. The N-type regions are, for example, substrate's internal regions corresponding to the back gate of a P-channel transistor (namely, the substrate itself and the well regions formed therein). A potential higher than the power supply voltage VCC is applied to these regions, and the bias level of these regions is prevented from becoming close to the power supply voltage VCC, in spite of the operations of the circuits provided for the substrate.

Referring to FIG. 7, a VBT detector 31 comprises a detection circuit 25 for detecting the bias level VBT, two delay circuits 36 and 37, and a NOR gate NOR2 for performing a logical operation with respect to the outputs of delay circuits 36 and 37. The VBT detector 25 is made up of N-channel MOS transistor TR21, P-channel MOS transistors TR22–TR27, and N-channel MOS transistor TR28. The current paths of these MOS transistors TR21–TR28 are connected in series. At the connection node N2 located between the current paths of transistors TR27 and TR28, a VBT monitor level is obtained, which corresponds to the potential difference between a ground voltage GND and the bias level VBT. Delay circuit 36 is made up of inverters INV22–INV26, and transistor TR33 is provided so as to suppress a rush current on the side of the N-channel MOS transistors. Delay circuit 37 also has a configuration for suppressing a rush current and is so designed as to have a high signal transmission speed when the signal level at node N2 changes from "H" to "L". The threshold of inverter INV17 of delay circuit 37 is higher than that of inverter INV22 of delay circuit 36.

The VBT detector 31 operates as follows. When the power supply is turned on, the signal at node N2 is "L" in level. This "L"-level signal is supplied to each of delay circuits 36 and 37, and "H"-level signals appear at nodes N3 and N4. Since, therefore, the output of NOR gate NOR2 is "L" in level, the ring oscillator 22 is actuated, and the charge pump circuit 23 raises the level of the N-type region 24 to a predetermined positive potential level (which is higher than the power supply voltage VCC). When the level of the N-type region 24 has been raised to the predetermined level, the monitor level (i.e., the level of the signal at node N2) is high. Therefore, "L"-level signals appear at nodes N3 and N4, and the output of NOR gate NOR2 becomes "H" in level, thus stopping the ring oscillator 22.

In the case where the bias level VBT gradually decreases due to a substrate current or the like, inverter INV22 of delay circuit 36 detects the signal level at monitor node N2 as "L" before inverter INV17 of delay circuit 37 detects so, as can be seen from FIG. 8, since the threshold VTH of inverter INV22 is lower than that of inverter INV17. As a result, an "H"-level signal appears at node N4. Since, therefore, the output of NOR gate NOR2 becomes "L" in level, the ring oscillator 22 is restarted. During the time, delay circuit 37 detects the monitor level as "H" because the threshold VTH of inverter INV17 of delay circuit 37 is high. Therefore, the signal at node N3 remains at the "L" level.

The case where the bias level VBT rapidly decreases will be explained with reference to FIG. 9. When the bias level VBT rapidly decreases, the signal level at node N2 also decreases rapidly. Therefore, inverter INV22 is first turned on, and immediately thereafter inverter INV17 is turned on. Since, in this case, the signal level at node N2 changes from "H" to "L", the signal transmission speed of delay circuit 37 is higher than that of delay circuit 36.

Therefore, the level of the signal at node N3 becomes "H" before the level of the signal at node N4, and the ring oscillator 22 is actuated. The time at which the ring oscillator 22 is stopped is determined by the delay circuit having a lower signal transmission speed. In other words, the ring oscillator 22 is stopped at the time determined by the delay circuit of the conventional circuit configuration.

As was detailed above, the present invention can provide a substrate biasing circuit which is for use in a semiconductor memory device and which can swiftly cope with various kinds of variations in the bias voltage without substantially increasing the current consumption.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A bias voltage generation circuit comprising:

bias voltage generation means for applying a predetermined bias potential to an internal region of a semiconductor substrate;

detection means for detecting the bias potential so as to control the bias voltage generation means; and signal control means, incorporated in the detection means and including at least first and second delay circuits having first and second bias potential detecting threshold levels, respectively, for controlling the bias voltage generation means, wherein said first bias potential detecting threshold level of said first delay circuit is higher than said second bias potential detecting threshold level of said second delay circuit and said first delay circuit has a shorter delay time than said second delay circuit.

2. A bias voltage generation circuit according to claim 1, wherein said internal region is a well region formed inside the semiconductor substrate.

3. A bias voltage generator circuit according to claim 1, wherein said internal region is a semiconductor substrate region having a conductivity type opposite to said semiconductor substrate.

4. A bias voltage generation circuit comprising:

bias voltage generation means for applying a predetermined negative bias potential to an internal region of a semiconductor substrate;

detection means for detecting the negative bias potential so as to control the bias voltage generation means; and signal control means, incorporated in the detection means and including at least two delay circuits having different negative bias potential detecting threshold levels, for controlling the bias voltage generation means, wherein a first of said delay circuits has a higher negative bias potential detecting threshold level and provides a shorter delay time than a second of said delay circuits.

5. A bias voltage generation circuit according to claim 4, wherein said internal region is a well region formed inside the semiconductor substrate.

6. A bias voltage generation circuit according to claim 4, wherein said internal region is a semiconductor substrate region having a conductivity type opposite to said semiconductor substrate.

7. A bias voltage generation circuit for use in a semiconductor memory device, comprising:

a MOS transistor formed in an element region of a semiconductor substrate;

bias voltage generation means for applying a predetermined bias potential to a semiconductor region, formed inside the element region and corresponding to a back gate of the MOS transistor;

detection means for detecting the bias potential so as to control the bias voltage generation means; and signal control means, incorporated in the detection means and including at least two delay circuits having different bias potential detecting threshold levels, for controlling the bias voltage generation means, wherein a first of said delay circuits has a higher bias potential detecting threshold level and provides a shorter delay time than a second of said delay circuits.

8. A bias voltage generation circuit according to claim 7, wherein said semiconductor region formed inside the element region is a well region formed inside the semiconductor substrate.

9. A bias voltage generation circuit according to claim 7, wherein said semiconductor region formed inside the element region is a semiconductor substrate region having a conductivity type opposite to said semiconductor substrate.

* * * * *